United States Patent [19]

Yanada et al.

[11] Patent Number: 6,099,713

[45] Date of Patent: Aug. 8, 2000

[54] TIN-SILVER ALLOY ELECTROPLATING BATH AND TIN-SILVER ALLOY ELECTROPLATING PROCESS

[75] Inventors: Isamu Yanada; Masanobu Tsujimoto, both of Hirakata, Japan

[73] Assignee: C. Uyemura & Co., Ltd., Osaka, Japan

[21] Appl. No.: 08/977,658

[22] Filed: Nov. 24, 1997

[30] Foreign Application Priority Data

Nov. 25, 1996 [JP] Japan .................................... 8-329229

[51] Int. Cl.[7] ...................................................... C25D 3/56
[52] U.S. Cl. .......................... 205/253; 205/254; 205/238; 106/1.23; 106/1.26
[58] Field of Search .................................... 205/252, 253, 205/254, 238; 106/1.23, 1.26

[56] References Cited

U.S. PATENT DOCUMENTS 4,246,077  1/1981  Hradil et al. .

FOREIGN PATENT DOCUMENTS 9-302498  11/1997  Japan .

*Primary Examiner*—K. Mayekar
*Attorney, Agent, or Firm*—Sughrue, Mion, Zinn, Macpeak & Seas, PLLC

[57] ABSTRACT

Disclosed is a tin-silver alloy electroplating bath containing: (A) stannous salt; (B) silver salt; (C) one kind or two or more kinds of acids selected from the group consisting of sulfuric acid, phosphoric acid, phosphonic acid, hydroxycarboxylic acid, alkanesulfonic acid, and alkanolsulfonic acid; (D) thiourea; (E) nonionic surface active agent; and (F) one kind or two or more kinds of additives selected from the group consisting of a mercapto group containing aromatic compound, dioxyaromatic compound, and unsaturated carboxylic acid. The electroplating using the above electroplating bath is allowed to form a homogeneous tin-silver alloy plated film having a good external appearance by eliminating preferential deposition of silver and substitutional deposition of silver on an anode and the plated film.

5 Claims, No Drawings

TIN-SILVER ALLOY ELECTROPLATING BATH AND TIN-SILVER ALLOY ELECTROPLATING PROCESS

BACKGROUND OF THE INVENTION

The present invention relates to an electroplating bath used for forming a tin-silver alloy plated film as a substitute for a tin-lead alloy solder, and a tin-silver alloy electroplating process using the bath.

In the case of soldering electronic parts, printed boards, and the like, tin plating or tin-lead alloy plating has been mainly performed. However, tin plating has a problem in generation of whiskers and tin-lead plating has a problem that lead contained therein recently becomes a focus as a cause of environmental pollution. As a result, it is expected to develop a tin alloy solder material not containing lead.

To be more specific, in recent years, from the viewpoint of regulation of utilization of lead, it is required to use a tin-silver alloy as a substitute for the conventional tin-lead alloy solder for soldering various parts constituting electronic equipment and the like, such as chip parts, hoop members, lead frames, semiconductor packages, bumps and printed boards, and to meet such a requirement, it is expected to develop an electroplating bath for forming a tin-silver alloy plated film.

As the tin-silver alloy electroplating bath, there is known a bath containing tin alkanesulfonate, silver alkanesulfonate, alkanesulfonic acid, and a nonionic surface active agent, from Japanese Patent Laid-open No. Hei 8-13185.

The conventional tin-silver alloy plating bath, however, tends to produce, during plating work, acicular, dendrite, whisker-like, granular, or powdery deposits in the order of several μm to several mm and/or burnt deposits on an end portion or edge portion or over the entire surface of a workpiece to be plated, resulting in failures in terms of external appearance of the plated surface, film, thickness, alloy composition, short-circuit between adjacent leads, and the like.

The simple bath of this type also has another problem that silver is liable to be deposited in preference to tin, and also silver tends to be deposited by substitution on a tin electrode or tin-silver alloy electrode and the plated film. This obstructs smooth plating work and degrades adhesiveness of the plated film.

A neutral or weak alkaline tin-silver alloy electroplating bath containing stannous chloride, silver iodide, potassium iodide and potassium pyrophosphate, which is different from the above-described strong acidic bath, is disclosed in Abstract of the 93th Meeting of Japan Society of Surface Technology, pp. 195. However, such an electroplating bath, when used for electroplating a printed board, may erode and peel an organic resist film.

SUMMARY OF THE INVENTION

In view of the foregoing, the present invention has been made, and an object of the present invention is to provide a tin-silver alloy electroplating bath particularly suitable for plating a printed board, which is capable of forming a tin-silver alloy plated film having a good external appearance by eliminating preferential deposition of silver and substitutional deposition of silver, and a tin-silver electroplating process using the bath.

The present inventor has earnestly studied to achieve the above object, and has accomplished the present invention.

According to a first aspect of the present invention (first invention), there is provided a tin-silver alloy electroplating bath containing:

(A) stannous salt;
(B) silver salt;
(C) one kind or two or more kinds of acids selected from the group consisting of sulfuric acid, phosphoric acid, phosphonic acid, hydroxycarboxylic acid, alkanesulfonic acid, and alkanolsulfonic acid;
(D) thiourea;
(E) nonionic surface active agent; and
(F) one kind or two or more kinds of additives selected from the group consisting of a mercapto group containing aromatic compound, dioxyaromatic compound, and unsaturated carboxylic acid.

According to the first aspect of the present invention, there is also provided a tin-silver alloy electroplating process, including the steps of;

dipping a workpiece to be plated in the above plating bath; and electroplating the workpiece dipped in the plating bath.

According to the above-described first aspect of the present invention, the tin-silver alloy plated film thus obtained exhibits a good external appearance without occurrence of acicular, dendrite, granular, or powdery deposits and/or burnt deposits, and also the plated film can ensure an alloy composition in which the tin content is in a range of 99.9 to 10 wt % and the silver content is in a range of 0.1 to 90 wt % by selecting the amounts of tin ions and silver ions. In addition, with respect to the alloy composition, since there occurs no preferential deposition of silver and no substitutional deposition of silver on a tin electrode or tin-silver alloy electrode and on the plated film, the alloy composition of the plated film substantially corresponds to the ratio between tin ions and silver ions in the plating bath. Further, a cathode current density can be selected in a wide range of 0.1 to 100 A/dm$^2$, and accordingly, as the electroplating process using the electroplating bath of the present invention, there can be adopted various electroplating methods such as rack plating, barrel plating and rackless plating (high speed plating, for example, hoop plating or jet plating).

According to a second aspect (second invention) of the present invention, there is provided a tin-silver alloy electroplating process including the steps of:

dipping a workpiece to be plated in a tin-silver alloy electroplating bath containing a stannous salt, a silver salt, and one kind or two or more kinds of acids, selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein silver metal is used as an anode and the amount of silver ions consumed by deposition of silver from the electroplating bath is replenished by electrolytic elusion of the silver anode; and the amount of stannous ions consumed by deposition of tin from the electroplating bath is replenished by addition of a stannous salt or a stannous oxide in the electroplating bath.

According to the second aspect of the present invention, there is also provided a tin-silver alloy electroplating process including the steps of:

dipping a workpiece to be plated in a tin-silver alloy electroplating bath containing a stannous salt, a silver salt, and one kind or two or more kinds of acids selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein the workpiece is dipped in the electroplating while being applied with a current; and the workpiece having been plated is lifted up from the electroplating bath while being applied with a current.

According to the second aspect of the present invention, there is also provided a tin-silver alloy electroplating process including the steps of:

dipping a workpiece to be plated in a tin-silver alloy electroplating bath containing a stannous salt, a silver salt, and one kind or two or more kinds of acids selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein silver metal is used as an anode and the amount of silver ions consumed by deposition of silver from the electroplating bath is replenished by electrolytic elusion of the silver anode, and the amount of stannous ions consumed by deposition of tin from the electroplating bath is replenished by addition of a stannous salt or a stannous oxide in the electroplating bath; and the workpiece is dipped in the electroplating while being applied with a current, and the workpiece having been plated is lifted up from the electroplating bath while being applied with a current.

According to the above-described second aspect of the present invention, silver is used as an anode and $Sn^{2+}$ is replenished, so that even by use of a simple plating bath not containing all of the components (A) to (F) but mainly containing the components (A), (B) and (C), it is possible to eliminate substitutional deposition of silver on an anode and to suppress a variation in concentration of $Ag^+$ in the plating bath; and further, since a workpiece is applied with a current when being dipped and lifted up into and from the plating bath, it is possible to eliminate substitutional deposition of silver on the workpiece or a plated film deposited on the workpiece and to eliminate occurrence of a failure in adhesiveness of the plated film. As a result, according to the second aspect of the present invention, it is possible to more certainly solve a difficulty in plating work.

DETAILED DESCRIPTION OF THE PREFERRED EMBODIMENT

The tin-silver alloy plating bath of the first invention, as described above, contains:

(A) stannous salt;

(B) silver salt;

(C) one kind or two or more kinds of acids selected from the group consisting of sulfuric acid, phosphoric acid, phosphonic acid, hydroxycarboxylic acid, alkanesulfonic acid, and alkanolsulfonic acid;

(D) thiourea;

(E) nonionic surface active agent; and (F) one kind or two or more kinds of additives selected from the group consisting of a mercapto group containing aromatic compound, dioxyaromatic compound, and unsaturated carboxylic acid.

As the stannous salt and the silver salt, there may be used those soluble in the following acids. To be more specific, examples of the stannous salts may include stannous organic sulfonate such as stannous methanesulfonate, stannous sulfate, stannous chloride, stannous gluconate, stannous citrate, and stannous lactate; and examples of the silver salts may include silver alkanesulfonate, silver sulfate, silver chloride, silver gluconate, silver citrate, and silver lactate.

The content of the stannous salt, based on the converted amount into the weight of $Sn^{2+}$, may be in a range of 1 to 99 g/L, preferably, in a range of 5–36 g/L, and the content of the silver salt, based on the converted amount into the weight of $Ag^+$, may be in a range of 1 to 99 g/L, preferably, in a range of 1 to 20 g/L. In this case, the ratio in weight between $Sn^{2+}$ and $Ag_+$ can be suitably selected; however, it may be selected in a range of $Sn^{2+}:Ag^+$=99:1 to 10:90, preferably, =99:1 to 50:50, more preferably, =98:2 to 60:40. When the content of $Ag^+$ is less than the above ratio, the content of silver in a plated film becomes excessively small, resulting in reduction in effects of preventing occurrence of whiskers of tin and of improving wettability of solder. When the content of $Ag^+$ is more than the above ratio, the content of silver in a plated film becomes excessively large, to excessively increase the melting temperature of the plated film or excessively increase the hardness of the plated film, resulting in reduction in at suitability for soldering.

As the component (C) of the electroplating bath of the present invention, there are used one kind or two or more kinds of acids selected from the group consisting of sulfuric acid, phosphoric acid, phosphonic acid, hydroxycarboxylic acid, alkanesulfonic acid, and alkanolsulfonic acid. Specific examples of hydroxycarboxylic acids may include a monocarboxylic acid such as lactic acid; a dicarboxylic acid such as gluconic acid, tartaric acid or malic acid; and a tricarboxylic acid such as citric acid. As each of the alkanesulfonic acid and alkanolsulfonic acid, there may be used a non-substitution type or a substitution type. For example, as the non-substitution type alkanesulfonic acid, there may be used an alkanesulfonic acid expressed by a formula of $C_nH_{2n+1}SO_3H$ where n is 1, 2, 3, 4 or 5, preferably, 1 or 2.

As the non-substitution type alnanolsulfonic acid, there may be used an alkanolsulfonic acid expressed by the following formula:

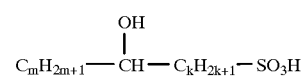

where m is 0, 1 or 2, and k is 1, 2 or 3.

As the substitution type alkanesulfonic and alkanolsulfonic acids, there may be respectively used alkanesulfonic and alkanolsulfonic acids in each of which part of hydrogen atoms of an alkyl group thereof is substituted for a halogen atom, aryl group, alkylaryl group, carboxylic group, or sulfonic acid group.

To be more specific, as the substitution type alkanesulfonic and alkanolsulfonic acids, there may be used one kind or two or more kinds selected from the group consisting of a methanesulfonic acid, ethanesulfonic acid, isethionic acid, propanesulfonic acid, 2-propaneesulfonic acid, butanesulfonic acid, 2-butanesulfonic acid, pentanesulfonic acid, cloropropanesulfonic acid, 2-hydoxyethane-1-sulfonic acid, 2-hydroxypropanesulfonic acid, 2-hydroxybutane-1-sulfonic acid, 2-hydroxypentane-sulfonic acid, 2-sulfoacetic acid, 2 or 3-sulfopropionic acid, and sulfosuccinic acid.

The content of the above acid may be in a range of 50 to 400 g/L, preferably, in a range of 100 to 200 g/L. When the content of the acid is less than 50 g/L, the stability of the plating bath is degraded, tending to produce precipitates; while when it is more than 400 g/L, there cannot be obtained an additional effect corresponding to the added amount.

Thiourea, which is used as the component (D) of the plating bath of the present invention, acts as a completing agent to tin and silver.

The content of thiourea may be in a range of 10 to 200 g/L, preferably, in a range of 50 to 100 g/L. When it is less than 10 g/L, the addition effect cannot be sufficiently attained; while when it is more than 200 g/L, thiourea may obstruct refinement of crystal of the plated film.

In the present invention, a nonionic surface active agent is used as the component (E). As such a nonionic surface active agent, there can be adopted a known type used for a tin-silver alloy electroplating bath. Specific examples of the nonionic surface active agents may include polyoxyethylenealkylether, polyoxyethylenealkylphenylether, polyoxyethylenealkylaminoether, polyoxyethylene fatty acid ester, polyoxyethylene polyhydric alcohol ether, and ethylene oxide propylene oxide block copolymer.

The content of the component (E) may be in a range of 0.01 to 50 g/L, preferably, in a range of 4 to 8 g/L. When it is less than 0.01 g/L, there may occur burnt deposits at a high current density; while when it is more than 50 g/L, a plated film is susceptible to blackening and/or unevenness of color.

The plating bath of the present invention further contains, as the component (F), additives selected from the group consisting of a mercapto group containing aromatic compound, dioxyaromatic compound, and unsaturated carboxylic acid. Such an additive gives to the plating bath an effect of preventing occurrence of acicular, dendrite, whisker-like, granular, or powdery deposits in the order of several μm to several mm and/or burnt deposits on an end portion or edge portion or over the entire surface of a workpiece to be plated.

Specific examples of mercapto group containing aromatic compounds may include 2-mercaptobenzoic acid, mercaptophenol, 2-mercaptobenzooxazole, and 2-mercaptobenzothiazole. The content of the additives may be in a range of 0.01 to 20 g/L, preferably, in a range of 0.01 to 5 g/L.

Specific examples of the dioxyaromatic compounds may include dioxybenzophenone, 3,4-dioxyphenylalanine, resorcin, catechol, hydroquinone, and diperine. The content of the dioxyaromatic compounds may be in a range of 0.001 to 20 g/L, preferably, in a range of 0.001 to 4 g/L.

Specific examples of unsaturated carboxylic acids may include benzoic acid, fumaric acid, phthalic acid, acrylic acid, citraconic acid, and methacrylic acid. The content of the unsaturated carboxylic acids may be in a range of 0.01 to 10 g/L, preferably, in a range of 0.01 to 2 g/L.

When the content of the above additive is less than the lower limit, there is a tendency to produce, during plating work, acicular, dendrite, whisker-like, granular, or powdery deposits in the order of several μm to several mm and/or burnt deposits on an end portion or edge portion or over the entire surface of a workpiece to be plated; while when it is more than the upper limit, a plated film is susceptible to blackening and/or unevenness of color.

The plating bath of the present invention may contain, in addition to the above components (A) to (F), gelatin, peptone and the like, if needed. In addition, the plating bath having the above composition generally has a pH of 1 or less; however, it may be, if needed, of a weak acid type or weak alkaline type having a pH in a range of about 1 to 9, particularly, in a range of about 2 to 7.

In the case of electroplating workpieces using the plating bath of the present invention, the workpieces are not particularly limited insofar as they can be subjected to electroplating. However, the plating bath of the present invention is particularly suitable for electroplating electric/electronic parts required for soldering, such as chip parts, hoop parts, lead frames, semiconductor packages, bumps, and printed boards.

As the plating method using the electroplating bath of the present invention, there may be effectively adopted rack plating, barrel plating, and a high speed plating such as hoop plating or jet plating. That is, in the present invention, the plating method is not particularly limited.

A cathode current density ($D_K$) is suitably selected in a range of 0.1 to 100 A/dm$^2$ depending on the plating method. For example, in the case of rack plating, it may be in a range of 0.5 to 5 A/dm$^2$, preferably, in a range of 1 to 3 A/dm$^2$, and in the case of barrel plating, it may be in a range of 0.1 to 1 A/dm$^2$, preferably, in a range of 0.2 to 0.5 A/dm$^2$.

The plating temperature is usually in a range of 15 to 35° C., and in general, it may be selected at room temperature. The plating bath may be not stirred; however, it is preferably stirred by cathode rocking or liquid fluidization by pumping or a stirrer.

As the anode, there may be used a soluble anode made from tin, silver, or a tin-silver alloy; or an insoluble anode formed of a platinum plated titanium plate, platinum plate, carbon plate or the like. In addition, to keep a specific ratio between $Sn^{2+}$ and $Ag^+$ in the plating bath, there must be replenished, at a suitable interval, a silver salt in the case of using tin as the anode plate; a stannous salt in the case of using silver as the anode plate; and a stannous salt and a silver salt in the case of using the insoluble anode.

It should be noted that the cathode current efficiency of the tin-silver alloy electroplating bath of the present invention is generally in a range of 70 to 98%.

According to the present invention, by suitably selecting the ratio between $Sn^{2+}$ and $Ag_+$ in the plating bath and carrying out electroplating in accordance with the above-described method, there can be obtained a tin-silver alloy plated film containing 99.9 to 10 wt % of tin and 0.1 to 90 wt % of silver. The plated film thus obtained is dense and exhibits a good external appearance, and thereby it is good in soldering performance.

According to the present invention, during plating work, there occur no preferential deposition of silver and no substitutional deposition of silver on an anode or a plated film, and also in the case of plating a printed board, there occurs no erosion and peeling of an organic resist film, and consequently, it is possible to improve the workability and to enhance the adhesiveness of the plated film.

According to the second invention, there is provided a tin-silver alloy electroplating process (1) including the steps of:

dipping a workpiece to be plated in a tin-silver alloy electroplating bath containing a stannous salt, a silver salt, and one kind or two or more kinds of acids selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein silver metal is used as an anode and the amount of silver ions consumed by deposition of silver from the electroplating bath is replenished by electrolytic elusion of the silver anode; and the amount of stannous ions consumed by deposition of tin from the electroplating bath is replenished by addition of a stannous salt or a stannous oxide in the electroplating bath.

The second invention also provides a tin-silver alloy electroplating process (2) including the steps of:

dipping a workpiece to be plated in a tin-silver alloy electroplating bath containing a stannous salt, a silver salt, and one kind or two or more kinds of acids selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein the workpiece is dipped in the electroplating while being applied with a current; and the workpiece having been plated is lifted up from the electroplating bath while being applied with a current.

The second invention also provides a tin-silver alloy electroplating process (3) including the steps of:

dipping a workpiece to be plated in a tin-silver alloy electroplating bath containing a stannous salt, a silver salt, and one kind or two or more kinds of acids selected from the group consisting of sulfuric acid, phosphoric acid, phosphonic acid, hydroxycarboxylic acid, alkanesulfonic acid, and alkanolsulfonic acid; and electroplating the workpiece dipped in the electroplating bath;

wherein silver metal is used as an anode and the amount of silver ions consumed by deposition of silver from the electroplating bath is replenished by electrolytic elusion of the silver anode, and the amount of stannous ions consumed by deposition of tin from the electroplating bath is replenished by addition of a stannous salt or a stannous oxide in the electroplating bath; and the workpiece is dipped in the electroplating while being applied with a current, and the workpiece having been plated is lifted up from the electroplating bath while being applied with a current.

In the second invention, the process (3) using the process (1) in combination with the process (2) is most preferable. As the plating bath used in the second invention, there can be effectively used the plating bath essentially containing the components (A) to (F) according to the first invention; however, there may be used the plating bath mainly containing the components (A), (B) and (C), preferably added with the component (E). In addition, the plating condition in the second invention is the same as that described in the first invention.

EXAMPLE

The present invention will be more clearly understood by way of the following inventive examples and comparative examples. However, these examples are for illustrative purposes only, and therefore, the present invention is not limited thereto.

Example 1

| | |
|---|---|
| stannous methanesulfonate | 23 g/L ($Sn^{2+}$: 9 g/L) |
| silver methanesulfonate | 2 g/L ($Ag^+$: 1 g/L) |
| thiourea | 100 g/L |
| gluconic acid | 200 g/L |
| polyoxyethylenenonylphenyl ether (number of EO additional mole: 7) | 5 g/L |
| 2-mercaptobenzoic acid | 1 g/L |
| citraconic acid | 0.5 g/L |
| pH | <1 |
| cathode current density | 0.5 A/dm$^2$ |
| bath temperature | 25° C. |

Example 1 -continued

| | |
|---|---|
| stirring | barrel |
| anode | tin (≧99.99 wt %) |
| plating time | 120 min |
| replenishment of silver * | |

* (Silver methanesulfonate was directly added and dissolved into plating solution to replenish $Ag^+$ in plating tank. The replenishment frequency was one time per 60 min, with 0.1 g/L of silver for one time.)

Example 2

| | |
|---|---|
| stannous methanesulfonate | 36 g/L ($Sn^{2+}$: 14 g/L) |
| silver sulfate | 9 g/L ($Ag^+$: 6 g/L) |
| methanesulfonic acid | 200 g/L |
| DL-lactic acid | 200 g/L |
| thiourea | 150 g/L |
| polyoxyethylene-beef tallow amino-ether (number of EO additional mole: 7) | 3 g/L |
| 2-mercaptobenzothiazole | 2 g/L |
| acrylic acid | 0.5 g/L |
| pH | <1 |
| cathode current density | 2 A/dm$^2$ |
| bath temperature | 25° C. |
| stirring | cathode rocker |
| anode | tin (70 wt %) + silver (30%) |
| plating time | 10 min |

Example 3

| | |
|---|---|
| stannous sulfate | 33 g/L ($Sn^{2+}$: 18 g/L) |
| silver methanesulfonate | 23 g/L ($Ag^+$: 12 g/L) |
| citric acid | 200 g/L |
| ammonium sulfate | 100 g/L |
| thiourea | 150 g/L |
| polyoxyethylenelauryl ether (number of EO additional mole: 4) | 10 g/L |
| 2-mercaptobenzothiazole | 3 g/L |
| fumaric acid | 0.3 g/L |
| pH | 7.0 |
| cathode current density | 3 A/dm$^2$ |
| bath temperature | 25° C. |
| stirring | cathode rocker |
| anode | silver (≧99.99 wt %) |
| plating time | 10 min |
| replenishment of tin * | |

* (Stannous sulfate was directly added and dissolved into plating solution to replenish $Sn^{2+}$ in plating tank. The replenishment frequency was one time per 10 min, with 0.1 g/L of tin for one time.)

Example 4

| | |
|---|---|
| stannous sulfate | 58 g/L ($Sn^{2+}$: 32 g/L) |
| silver sulfate | 15 g/L ($Ag^+$: 8 g/L) |
| sulfuric acid | 200 g/L |
| thiourea | 200 g/L |
| gluconic acid | 200 g/L |
| ethylene oxide propylene oxide block copolymer (total molecular weight: 2500, EO/PO = 60/40) | 7 g/L |
| hydroquinone | 2 g/L |
| pH | <1 |
| cathode current density | 5 A/dm$^2$ |
| bath temperature | 25° C. |

-continued

Example 4

| | |
|---|---|
| stirring | jet |
| anode | platinum |
| plating time | 5 min |
| replenishment of tin and silver * | |

* (Stannous sulfate and silver sulfate were directly added and dissolved into plating solution to replenish $Ag^+$ and $Sn^{2+}$ in plating tank. The replenishment frequency was one time per 5 min, with 0.8 g/L of tin and 0.2 g/L of silver for one time.)

Comparative Example 1

| | |
|---|---|
| stannous methanesulfonate | 18 g/L ($Sn^{2+}$: 9 g/L) |
| silver methanesulfonate | 2 g/L ($Ag^+$: 1 g/L) |
| methanesulfonic acid | 100 g/L |
| polyoxyethylenenonylphenyl ether (number of EO additional mole: 7) | 5 g/L |
| pH | <1 |
| cathode current density | 0.5 A/dm$^2$ |
| bath temperature | 25° C. |
| stirring | barrel |
| anode | tin ($\geq$99.99 wt %) |
| plating time | 120 min |
| replenishment of silver * | |

* (Silver methanesulfonate was directly added and dissolved into plating solution to replenish $Ag^+$ in plating tank. The replenishment frequency was one time per 60 min, with 0.1 g/L of silver for one time.)

Comparative Example 2

| | |
|---|---|
| stannous sulfate | 33 g/L ($Sn^{2+}$: 18 g/L) |
| silver sulfate | 23 g/L ($Ag^+$: 12 g/L) |
| potassium iodide | 200 g/L |
| potassium pyrophosphate | 200 g/L |
| polyoxyethylenelauryl ether (number of EO additional mole: 4) | 10 g/L |
| pH | 9.0 |
| cathode current density | 3 A/dm$^2$ |
| bath temperature | 25° C. |
| stirring | cathode rocker |
| anode | platinum |
| plating time | 10 min |
| replenishment of tin and silver * | |

* (Stannous sulfate and silver sulfate were directly added and dissolved into plating solution to replenish $Sn^{2+}$ and $Ag^+$ in plating tank. The replenishment frequency was one time per 5 min, with 0.8 g/L of tin and 0.2 g/L of silver for one time.)

The electroplating test was made using the above plating baths under the corresponding conditions. In Example 1 and Comparative Example 1, workpieces such as a chip resistor, chip capacitor, and crystal oscillator were plated by the known barrel plating method. In Examples 2, 3 and 4 and Comparative Example 2, workpieces such as a lead frame, semiconductor package, bump, and printed board were plated by the known rack plating method.

The plated films thus obtained were subjected to visual observation. As a result, the plated film obtained in each of Examples 1 to 4 exhibited a semi-brightness and was colored in grayish white, and further, the plated film was free of failure in terms of external appearance, that is, it had not acicular, dendrite, whisker-like, granular or powdery deposits and/or burnt deposits. The contents of silver in the plated films obtained in Examples 1 to 4 were 9 wt %, 27 wt %, 37 wt %, and 19 wt %, which were close to the alloy compositions in the plating baths used in Examples 1 to 4, respectively. Even in the plating test using a printed board as a workpiece, a good plated film was obtained, and further, an organic resist film of the printed board was not peeled, with no permeation of the plating solution therethrough.

The plated film obtained in Comparative Example 1 was colored in gray with slight unevenness. The content of silver in the plated film was 35 wt % which was very larger than the alloy composition of the plating bath. Further, silver was deposited by substitution over the entire surface of the tin anode.

The plated film in Comparative Example 2 was colored in grayish white with slight unevenness. The content of silver in the plated film was 36 wt % which was close to the alloy composition of the plating bath; however, as a result of plating test using a printed board as a workpiece, an organic resist film of the printed board was peeled, resulting in permeation of the plating solution therethrough.

Example 5

| | |
|---|---|
| stannous methanesulfonate | 18 g/L ($Sn^{2+}$: 9 g/L) |
| silver methanesulfonate | 2 g/L ($Ag^+$: 1 g/L) |
| methanesulfonic acid | 100 g/L |
| polyoxyethylenenonylphenyl ether (number of EO additional mole: 7) | 5 g/L |
| pH | |
| cathode current density | 0.3 A/dm$^2$ |
| bath temperature | 25° C. |
| stirring | barrel |
| anode | silver ($\geq$99.99 wt %) |
| plating time | 240 min |
| replenishment of tin * | |

* (Stannous oxide was dissolved in plating solution introduced in another tank and the replenished plating bath was sent back to the plating tank. The replenishment frequency was one time per 40 min, with 0.3 g/L of tin for one time.)

In the plating process in Example 5, between the initial state of plating and the state after an elapse of 240 min, there was little variation in each of the amounts of tin and silver in the plating bath, little variation in external appearance of the tin-silver alloy plated film, and little variation in the content (8–10 wt %) of silver in the plated film. As a result, it was proved that the plating in Example 5 was stable.

Additionally, in the above plating process, since a silver anode was used, substitutional deposition of silver did not occur; however, in the case where a tin-silver (90/10) alloy was used as the anode and tin was not replenished, silver in the plating solution was deposited by substitution on the tin-silver alloy anode during stoppage of plating work and correspondingly the amount of silver in the plating solution was decreased and the amount of tin in the plating solution was increased. As a result, in the subsequent plating, there was formed a tin-silver plated film in which the content of silver was low and the content of tin was large.

Example 6

| | |
|---|---|
| stannous 2-hydroxypropane sulfonate | 63 g/L ($Sn^{2+}$: 16 g/L) |
| silver 2-hydroxypropane sulfonate | 10 g/L ($Ag^+$: 4 g/L) |
| 2-hydroxypropane sulfonic acid | 200 g/L |
| polyoxyethylenenonylphenyl ether (number of EO additional mole: 7) | 8 g/L |
| pH | <1 |
| cathode current density | 2 A/dm$^2$ |
| bath temperature | 25° C. |
| stirring | cathode rocker |

-continued

Example 6

| | |
|---|---|
| anode | silver (≧99.99 wt %) |
| plating time | 20 min |
| replenishment of tin * | |

* (Stannous oxide was directly added and dissolved into plating solution to replenish $Sn^{2+}$ in plating tank. The replenishment frequency was one time per 10 min, with 0.5 g/L of tin for one time.)

In the plating process in Example 6, between the initial state of plating and the state after an elapse of 20 min, there was little variation in each of the amounts of tin and silver in the plating bath, little variation in external appearance of the tin-silver alloy plated film, and little variation in the content (18–20 wt %) of silver in the plated film. As a result, it was proved that the plating in Example 6 was stable.

Additionally, in the above plating process, since a silver anode was used, substitutional deposition of silver did not occur; however, in the case where a tin-silver (80/20) alloy was used as the anode and tin was not replenished, silver in the plating solution was deposited by substitution on the tin-silver alloy anode during stoppage of plating work and correspondingly the amount of silver in the plating solution was decreased and the amount of tin in the plating solution was increased. As a result, in the subsequent plating, there was formed a tin-silver plated film in which the content of silver was low and the content of tin was large.

Example 7

In this example, the effect of applying a current to a workpiece was examined. When a workpiece was plated in the same procedure as in Example 5 except that the workpiece was dipped in the plating bath while being not applied with a current, silver was deposited by substitution on the workpiece in the plating solution, and thereby the adhesiveness between the workpiece and the plated film was degraded. When a workpiece was plated in the same procedure as in Example 5 except that the workpiece was lifted up from the plating bath while being not applied with a current, silver was deposited by substitution on the surface of the plated film, and thereby the plated film exhibited a blackened powdery appearance.

On the contrary, when a workpiece was plated in the same procedure as in Example 5 except that the workpiece was dipped and lifted up into and from the plating bath while being applied with a current, silver was not deposited by substitution on the workpiece and the plated film, so that the adhesiveness between the workpiece and the plated film was desirable and the external appearance of the plated film was also desirable.

Example 8

In this example, like Example 7, the effect of applying a current to a workpiece was examined. When a workpiece was plated in the same procedure as in Example 6 except that the workpiece was dipped in the plating bath while being not applied with a current, silver was deposited by substitution on the workpiece in the plating solution, and thereby the adhesiveness between the workpiece and the plated film was degraded. When a workpiece was plated in the same procedure as in Example 6 except that the workpiece was lifted up from the plating bath while being not applied with a current, silver was deposited by substitution on the surface of the plated film, and thereby the plated film exhibited a blackened powdery appearance.

On the contrary, when a workpiece was plated in the same procedure as in Example 6 except that the workpiece was dipped and lifted up into and from the plating bath while being applied with a current, silver was not deposited by substitution on the workpiece and the plated film, so that the adhesiveness between the workpiece and the plated film was desirable and the external appearance of the plated film was also desirable.

As described above, by use of the tin-silver alloy electroplating bath of the present invention, there can be obtained a homogeneous tin-silver alloy plated film having a good external appearance by eliminating preferential deposition of silver and substitutional deposition of silver on an anode and the plated film.

We claim:

1. A tin-silver alloy electroplating bath containing:
   (A) stannous salt;
   (B) silver salt;
   (C) an acid selected from the group consisting of sulfuric acid, phosphoric acid, phosphonic acid, hydroxycarboxylic acid, alkanesulfonic acid, and alkanolsulfonic acid, or a mixture thereof;
   (D) thiourea;
   (E) nonionic surface active agent; and
   (F) an additive selected from the group consisting of a mercapto group containing aromatic compound, dioxyaromatic compound, and unsaturated carboxylic acid; or a mixture thereof.

2. A tin-silver alloy electroplating process, comprising the steps of;
   dipping a workpiece to be plated in said plating bath as claimed in claim 1; and
   electroplating the workpiece dipped in said plating bath.

3. A tin-silver alloy electroplating process, comprising the steps of;
   dipping a workpiece to be plated in a tin-silver alloy electroplating bath containing a stannous salt, a silver salt, and an acid selected from the group consisting of sulfuric acid, phosphoric acid, phosphonic acid, hydroxycarboxylic acid, alkanesulfonic acid, and alkanolsulfonic acid, or a mixture thereof; and
   electroplating the workpiece dipped in said electroplating bath;
   wherein silver metal is used as an anode and the amount of silver ions consumed by deposition of silver from said electroplating bath is replenished by electrolytic elusion of said silver anode; and
   the amount of stannous ions consumed by deposition of tin from said electroplating bath is replenished by addition of a stannous salt or a stannous oxide in said electroplating bath.

4. A tin-silver alloy electroplating process comprising the steps of:
   dipping a workpiece to be plated in a tin-silver alloy electroplating bath containing a stannous alt, a silver salt, and an acid selected from the group consisting of sulfuric acid, phosphoric acid, phosphonic acid, hydroxycarboxylic acid, alkanesulfonic acid, and alkanolsulfonic acid or a mixture thereof; and electroplating the workpiece dipped in said electroplating bath;

wherein the workpiece is dipped in said electroplating while being applied with a current; and the workpiece having been plated is lifted up from said electroplating bath while also being applied with a current.

5. A tin-silver alloy electroplating process comprising the steps of:

dipping a workpiece to be plated in a tin-silver alloy electroplating bath containing a stannous salt, a silver salt, and an acid selected from the group consisting of sulfuric acid, phosphoric acid, phosphonic acid, hydroxycarboxylic acid, alkanesulfonic acid, and alkanolsulfonic acid, or a mixture thereof; and electroplating the workpiece dipped in said electroplating bath;

wherein silver metal is used as an anode and the amount of silver ions consumed by deposition of silver from said electroplating bath is replenished by electrolytic elusion of said silver anode, and the amount of stannous ions consumed by deposition of tin from said electroplating bath is replenished by addition of a stannous salt or a stannous oxide in said electroplating bath; and the workpiece is dipped in said electroplating while being applied with a current, and the workpiece having been plated is lifted up from said electroplating bath while being applied with a current.

* * * * *